US011933841B2

(12) United States Patent
Sirisha et al.

(10) Patent No.: US 11,933,841 B2
(45) Date of Patent: Mar. 19, 2024

(54) SINGLE PIN DFT ARCHITECTURE FOR USBPD ICS

(71) Applicant: SILICONCH SYSTEMS PVT LTD, Karnataka (IN)

(72) Inventors: Munnangi Sirisha, Andhra Pradesh (IN); Rakesh Kumar Polasa, Karnataka (IN); Satish Anand Verkila, Karnataka (IN)

(73) Assignee: SILICONCH SYSTEMS PVT LTD, Karnataka (IN)

( * ) Notice: Subject to any disclaimer, the term of this patent is extended or adjusted under 35 U.S.C. 154(b) by 311 days.

(21) Appl. No.: 17/495,756

(22) Filed: Oct. 6, 2021

(65) Prior Publication Data

US 2022/0244309 A1    Aug. 4, 2022

(51) Int. Cl.
*G01R 31/317*    (2006.01)
*G01R 31/3183*    (2006.01)

(52) U.S. Cl.
CPC . *G01R 31/31701* (2013.01); *G01R 31/31713* (2013.01); *G01R 31/31721* (2013.01); *G01R 31/31724* (2013.01); *G01R 31/3183* (2013.01)

(58) Field of Classification Search
None
See application file for complete search history.

(56) References Cited

U.S. PATENT DOCUMENTS 6,829,726 B1 * 12/2004 Korhonen ............. G06F 11/221
    714/25
7,103,512 B2 * 9/2006 Julicher ................ G06F 11/221
    702/120
2004/0064273 A1 * 4/2004 Le .......................... G06F 1/266
    702/60

FOREIGN PATENT DOCUMENTS

| CN | 103218280 A | * | 7/2013 | |
|----|-------------|---|--------|---|
| CN | 105353309 A | * | 2/2016 | |
| CN | 108663590 A | * | 10/2018 | |
| CN | 211787061 U | * | 10/2020 | |
| CN | 112088476 A | * | 12/2020 | ......... G06F 13/4081 |

(Continued)

OTHER PUBLICATIONS

Universal Serial Bus Type-C Cable and Connector Specification Release 2.0, USB 3.0 Promoter Group, Aug. 2019 (373 pages).

(Continued)

*Primary Examiner* — Guerrier Merant
(74) *Attorney, Agent, or Firm* — Procopio, Cory, Hargreaves & Savitch LLP

(57) ABSTRACT

The present disclosure provides a DFT architecture for ICs and a method for testing the ICs with the proposed DFT architecture. The present disclosure also includes a focus on USB PD protocol with respect to the DFT architecture. The present disclosure also includes focus on testing IC with single I/O pin. The DFT architecture primarily comprises of a test mode controller and reuses the USBPD protocol framework logic comprising analog USBPD CC circuitry in analog block and the USBPD signaling, protocol logic in digital block for the test purposes. The DFT architecture is implemented with analog test modes and digital test modes using a single I/O pin, wherein analog test modes comprises of analog trims and observation modes and digital test modes comprises of LBIST, ATPG and digital observation modes. The method disclosed is directed to the functions associated with testing the USBPD ICS using single I/O pin.

13 Claims, 9 Drawing Sheets

(56) References Cited

FOREIGN PATENT DOCUMENTS

| | | | | | |
|---|---|---|---|---|---|
| CN | 113228445 | A | * | 8/2021 | ......... G06F 13/4282 |
| CN | 114528160 | A | * | 5/2022 | |
| TW | 200408818 | A | * | 6/2004 | .......... G06F 11/2284 |
| TW | I765421 | B | * | 11/2020 | |

OTHER PUBLICATIONS

Universal Serial Bus Power Delivery Specification, Revision 3.0, Version 2.0, Aug. 29, 2019 (657 pages).

* cited by examiner

SINGLE PIN DFT ARCHITECTURE FOR USBPD ICS

CROSS REFERENCE TO RELATED APPLICATIONS

This Paris Convention Patent Application claims benefit under 35 U.S.C. § 119 and claims priority to Indian Patent Application No. IN 202141004161, filed on Jan. 30, 2021, titled "SINGLE PIN DFT ARCHITECTURE FOR USBPD ICs", the content of which is incorporated herein in its entirety by reference for all purposes.

TECHNICAL FIELD

The present disclosure generally relates to Universal Serial Bus Power Delivery (USBPD) designs. More particularly, the present disclosure relates to a design for testing (DFT) architecture for testing USBPD devices using a single Input/Output (I/O) pin.

BACKGROUND

Background description includes information that can be useful in understanding the present invention. It is not an admission that any of the information provided herein is prior art or relevant to the presently claimed invention, or that any publication specifically or implicitly referenced is prior art.

There is a general need in the current art for a design for testing (DFT) architecture that facilitates the testing of single input/output (I/O) pin integrated circuits (ICs), without any additional pin overhead that may specifically be required for testing. With regards to semiconductor manufacturing technology, there have been many advances and with such advances, new problems to solve may arise. Particularly in the current context, ICs can have manufacturing faults making those ICs unusable. For example, there can be an electronic/electric disconnect due to inefficient manufacturing and such events can cause inconvenience to the manufacturer. Thus, post silicon validation or testing of ICs is mandatory to identify any such faults or defects. Testing can occur through various electronic pins that the IC having the DFT architecture may have. While a defined and standardized manufacturing is desired both from an economic viewpoint and an aesthetic viewpoint, it is ideal that such testing occurs through an electronic pin that affords the most efficient and effective result.

DFT makes every IC to be testable, by implementing various test modes in the design to provide support for post silicon testing. Mixed signal ICs can have faults in both of their analog and digital portions. Hence, there is a need to implement analog and digital test modes for mixed signal ICs. All these test modes require multiple pins for the test control and test data. This pin overhead becomes significant in pin-constrained designs arising the need for an architecture that enables testing without any additional test pins and reusing the available pins without compromising on quality. Thus, there is a need for developing test modes for ICs that involve better, efficient, and effective pin arrangements.

One other prevalent issue in the field of post silicon validation or testing of the pin constrained ICs includes increasing test accuracy and coverage with lesser test durations. This follows that there is a need to provide a DFT architecture for pin constrained designs with reasonable test times while at the same time, ensuring good coverage and increasing the accuracy.

Efforts have been made in the related or existing art to provide a DFT architecture for testing integrated circuits using existing single I/O pins.

USBPD ICs can be part of broad range of applications comprising source, sink, DRP (Dual role power) devices and e-markers and the like. Some of the applications may require USBPD ICs with very lesser pin count as low as single functional pin, for example: E-marker ICs can be manufactured with only functional pin i.e. CC pin. However, there is no scope to make such ICs testable with the available single functional pin without compromising on test coverage and test times.

SUMMARY

Therefore, there is a need in the art to provide an efficient and effective DFT architecture for testing single I/O pin integrated circuits that can afford reduced testing time duration and greater coverage and accuracy as to the testing aspect. There is also a need in the art to make such ICs testable with the available single functional pin.

All publications herein are incorporated by reference to the same extent as if each individual publication or patent application were specifically and individually indicated to be incorporated by reference. Where a definition or use of a term in an incorporated reference is inconsistent or contrary to the definition of that term provided herein, the definition of that term provided herein applies and the definition of that term in the reference does not apply.

In some embodiments, the numbers expressing quantities or dimensions of items, and so forth, used to describe and claim certain embodiments of the invention are to be understood as being modified in some instances by the term "about." Accordingly, in some embodiments, the numerical parameters set forth in the written description and attached claims are approximations that may vary depending upon the desired properties sought to be obtained by a particular embodiment. In some embodiments, the numerical parameters should be construed in light of the number of reported significant digits and by applying ordinary rounding techniques. Notwithstanding that the numerical ranges and parameters setting forth the broad scope of some embodiments of the invention are approximations, the numerical values set forth in the specific examples are reported as precisely as practicable. The numerical values presented in some embodiments of the invention may contain certain errors necessarily resulting from the standard deviation found in their respective testing measurements.

As used in the description herein and throughout the claims that follow, the meaning of "a," "an," and "the" includes plural reference unless the context clearly dictates otherwise. Also, as used in the description herein, the meaning of "in" includes "in" and "on" unless the context clearly dictates otherwise.

Groupings of alternative elements or embodiments of the invention disclosed herein are not to be construed as limitations. Each group member can be referred to and claimed individually or in any combination with other members of the group or other elements found herein. One or more members of a group can be included in, or deleted from, a group for reasons of convenience and/or patentability. When any such inclusion or deletion occurs, the specification is herein deemed to contain the group as modified thus fulfilling the written description of all groups used in the appended claims.

Some of the objects of the present disclosure, which at least one embodiment herein satisfies are as listed herein below.

It is an object of the present disclosure to provide a DFT architecture for testing integrated circuits using existing single I/O pins.

It is another object of the present disclosure to provide a simple and cost effective DFT architecture for testing integrated circuits using existing single I/O pins.

It is another object of the present disclosure to provide a reliable and efficient DFT architecture for testing integrated circuits using existing single I/O pins.

It is another object of the present disclosure to provide a robust DFT architecture for testing integrated circuits using existing single I/O pins.

It is another object of the present disclosure to provide a DFT architecture for testing integrated circuits using existing single I/O pins that eliminates the need for separate test pins.

It is another object of the present disclosure to provide a DFT architecture for testing integrated circuits associated with USBPD framework.

The present disclosure generally relates to integrated circuits. More particularly, the present disclosure relates to a DFT architecture for testing integrated circuits using existing single I/O pins which eliminates the need for separate test pins.

This summary is provided to introduce simplified concepts of a system for time bound availability check of an entity, which are further described below in the detailed description. This summary is not intended to identify key or essential features of the claimed subject matter, nor is it intended for use in determining/limiting the scope of the claimed subject matter.

An aspect of the present disclosure pertains to a system including a design for testing (DFT) architecture for use in testing integrated circuits (ICs) associated with universal serial bus power delivery (USBPD) using a single input-output I/O pin. The system includes an analog block including USBPD configuration channel (CC) circuitry that detects the short circuit (SC) and over currents (OC) on CC pin, receives and transmits the data on CC pin for USBPD framework; and a digital block including a USBPD block handling USBPD communication packets and signaling for USBPD framework, a test mode controller configured to receive the CC pin SC detection and OC detection, test related USBPD packet and signaling data from the USBPD block.

In an aspect, USBPD CC circuitry in an analog block and USBPD block in a digital block designed for the purpose of USBPD framework are reused for the test mode purposes in the proposed architecture.

In an aspect, the test mode controller is further configured to detect or activate a test mode based on the USB PD packet data and USB PD signaling data received on the CC pin.

In an aspect, the test mode controller is configured to control the test mode with respect to the DFT architecture.

In an aspect, the test modes includes analog test modes involving trims and observation modes, digital test modes comprising a logic built-in self-test (LBIST) mode for covering and detecting the defects in the digital components associated with integrated circuits, an automatic test pattern generation (ATPG) mode operating at lower speeds which is directed to covering and further detecting the defects that are uncovered or undetected by the LBIST mode and a digital observation mode for debug purposes. In an aspect, the analog and digital test modes are implemented with respect to the single I/O pin which is the CC pin with respect to USBPD integrated circuits.

In an aspect, the ATPG test mode operate based on a scan chain technique that includes a sequential shift-in phase and shift-out phase, with the CC pin corresponding to input and output respectively during shift-in and shift-out operation.

In an aspect, test parameters associated with the Analog and digital test modes are programmed through USBPD packet according to USB-C Power delivery protocol.

In an aspect, the scan shift-in and shift-out phases that occur simultaneously during the legacy ATPG scan shift phase are implemented sequentially.

In an aspect, the scan shift-in and the shift-out phases utilizes the single I/O pin for transmitting and receiving the scan data.

In an aspect, scan clock and data are encoded onto single I/O pin by reusing the USBPD Biphase Mark Coding (BMC) encoding/decoding framework with respect to testing of USBPD integrated circuit.

In an aspect, the USBPD BMC encoding/decoding framework is tested as part of LBIST mode and excluded from scan in ATPG mode In an aspect, scan shift-in, scan capture, scan shift-out and scan reset phases are automatically transitioned in the design without any external intervention based on the programmed chain length and pattern counts.

In an aspect, in one exemplary configuration, handshaking mechanism can be enabled between the IC and tester during ATPG mode for direction change of CC pin, where in IC applies weak pull up on CC line at the end of each shiftout phase after completion of BMC encoded data transfer and tester sends the acknowledgment to IC by pulling the CC line low using a strong pulldown for CC pin direction change from transmitter (TX) to receiver (RX) i.e. design transitions from shift-out phase to shift-in phase. Similarly, tester applies weak pullup on the CC line at the end of each shift-in phase after completion of the BMC encoded data transfer and IC sends acknowledgement to the tester by pulling the CC low using a strong pull down for CC pin direction change from RX to TX i.e. design transitions from shift-in phase to shift-out phase.

In an aspect, test mode reset, and test mode exit are automatically triggered in the design after the ATPG test completion without any external intervention based on the programmed pattern counts.

In an aspect, test mode reset, and test mode exit are automatically triggered in the design after the LBIST completion without any external intervention based on the BIST done indication from LBIST logic. Further, LBIST done and exit are indicated to tester on the CC pin.

In an aspect, LBIST logic block may be tested as part of ATPG test mode and excluded from scan in LBIST test mode.

Another aspect of the present disclosure pertains to a method for testing an USBPD integrated circuit (IC). The method includes sending custom USBPD signaling and USBPD packets on the CC pin; configuring the test modes by means of custom USBPD packets on the CC pin; detecting the test mode entry based on the received custom USBPD signaling data and packets on CC pin; observing the test mode parameters on the CC pin; and causing an auto test mode exit or exiting by means of short circuit or over current on the CC pin.

In an aspect, during LBIST test mode, the method includes: configuring LBIST test mode parameters such as pseudo-random pattern generator (PRPG) seed, pattern count, expected LBIST signature by means of a USB PD packet on the CC pin; triggering the LBIST test mode by means of USB PD packet on the CC pin; automatically resetting the digital logic and causing an LBIST test mode exit after the LBIST test mode completion without external intervention; and reading the LBIST test mode signature, status by means of a USB PD packet on the single CC pin.

In an aspect, during ATPG test mode, the method includes: configuring ATPG test mode parameters such as scan chain length, pattern count, Launch on Capture/Launch on extra-shift (LOC/LOES) mode selects, scan clock frequency by means of a USB PD packet on the CC pin; triggering the ATPG test mode by means of USBPD packet on the CC pin; driving Scan data-in and scan clock on single CC pin by means of BMC encoding during scan shift-in phase of operation; driving scan data-out and scan clock on single CC pin by means of BMC encoding during scan shift-out phase of operation; automatically transitioning from scan shift-in to scan capture/reset, scan capture/reset to scan shift-out and scan shift-out to scan shift-in phases based on the programmed scan chain length without any external intervention; and automatically resetting the design and exiting the scan test mode based on the programmed pattern count without any external intervention.

In an aspect, during digital observation mode, the method includes configuring test mode parameters such as digital observation multiplexer selects by means of USBPD packets on the CC pin: selecting the digital observation mode by the means of the USBPD packets on CC pin; observing the internal digital signals on the CC pin during test mode operation; and exiting the digital observation test mode by means of short circuiting (SC) CC line to GND or by driving Over Current (OC) onto CC line.

In an aspect, during analog test mode the method includes: configuring the analog test mode parameters by means of USBPD packets on the CC pin; selecting the analog test modes by means of USBPD packets on the CC line; performing analog trimming by means of custom USBPD signaling; observing the analog parameters on the CC line during test mode operation by means of custom USBPD signaling; and exiting the analog test modes by means of short circuiting CC line to GND or by driving over current onto CC line.

Various objects, features, aspects, and advantages of the inventive subject matter will become more apparent from the following detailed description of preferred embodiments, along with the accompanying drawing figures in which like numerals represent like components.

BRIEF DESCRIPTION OF THE DRAWINGS

The diagrams are for illustration only, which thus is not a limitation of the present disclosure, and wherein.

DETAILED DESCRIPTION

Figure 1:
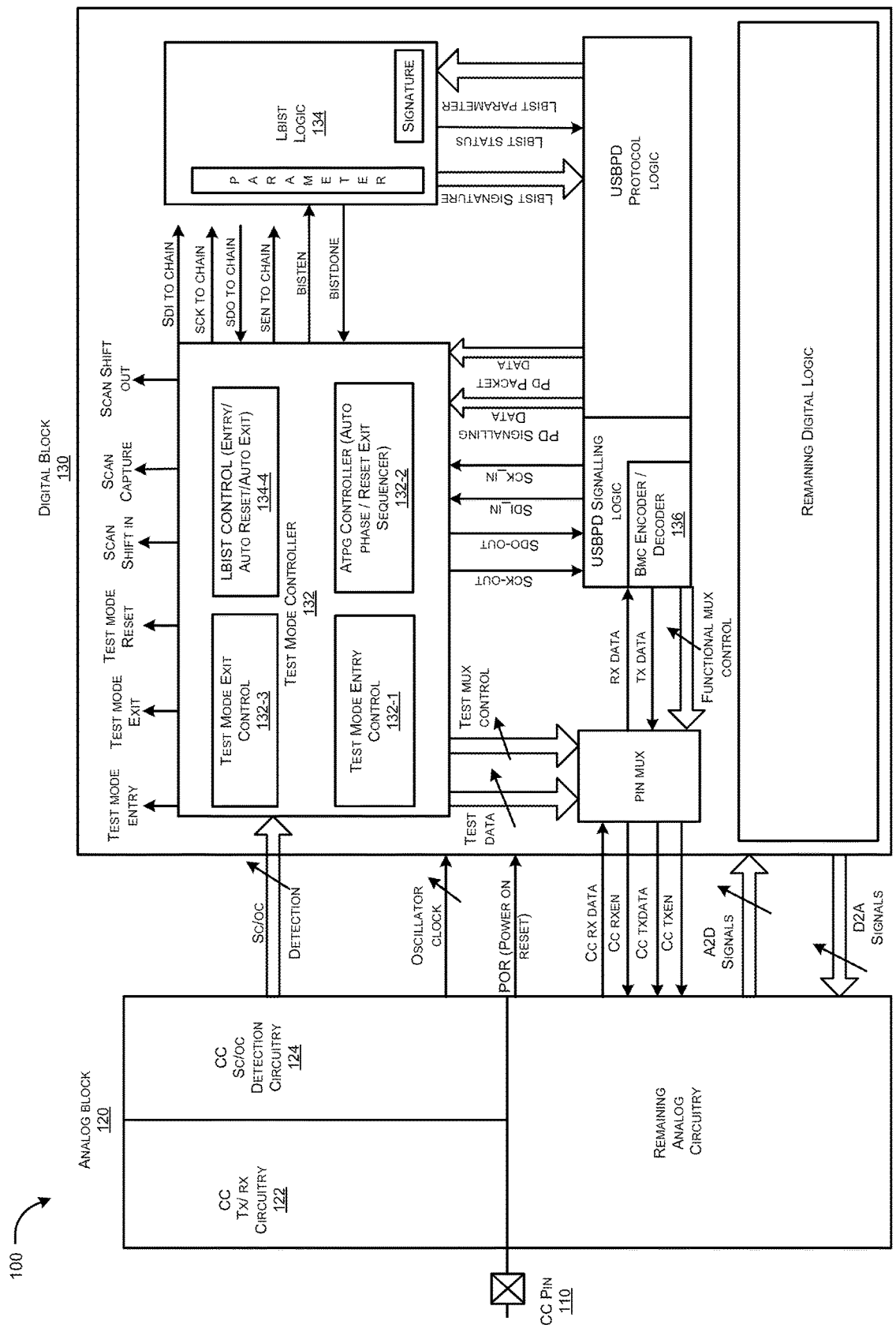
FIG. 1 illustrates an exemplary representation of a top level block diagram of an integrated circuit with a single pin DFT architecture, in association with a USBPD system, in accordance with an embodiment of the present disclosure.

The following is a detailed description of embodiments of the disclosure depicted in the accompanying drawings. The embodiments are in such detail as to clearly communicate the disclosure. However, the amount of detail offered is not intended to limit the anticipated variations of embodiments; on the contrary, the intention is to cover all modifications, equivalents, and alternatives falling within the spirit and scope of the present disclosure as defined by the appended claims.

In the following description, numerous specific details are set forth in order to provide a thorough understanding of embodiments of the present invention. It will be apparent to one skilled in the art that embodiments of the present invention may be practiced without some of these specific details.

Embodiments of the present invention include various steps, which will be described below. The steps may be performed by hardware components or may be embodied in machine-executable instructions, which may be used to cause a general-purpose or special-purpose processor programmed with the instructions to perform the steps. Alternatively, steps may be performed by a combination of hardware, software, and firmware and/or by human operators.

Various methods described herein may be practiced by combining one or more machine-readable storage media containing the code according to the present invention with appropriate standard computer hardware to execute the code contained therein. An apparatus for practicing various embodiments of the present invention may involve one or more computers (or one or more processors within a single computer) and storage systems containing or having network access to computer program(s) coded in accordance with various methods described herein, and the method steps of the invention could be accomplished by modules, routines, subroutines, or subparts of a computer program product.

If the specification states a component or feature "may", "can", "could", or "might" be included or have a characteristic, that particular component or feature is not required to be included or have the characteristic.

As used in the description herein and throughout the claims that follow, the meaning of "a," "an," and "the" includes plural reference unless the context clearly dictates otherwise. Also, as used in the description herein, the meaning of "in" includes "in" and "on" unless the context clearly dictates otherwise.

Exemplary embodiments will now be described more fully hereinafter with reference to the accompanying drawings, in which exemplary embodiments are shown. These exemplary embodiments are provided only for illustrative purposes and so that this disclosure will be thorough and complete and will fully convey the scope of the invention to those of ordinary skill in the art. The invention disclosed may, however, be embodied in many different forms and should not be construed as limited to the embodiments set forth herein. Various modifications will be readily apparent to persons skilled in the art. The general principles defined herein may be applied to other embodiments and applications without departing from the spirit and scope of the invention. Moreover, all statements herein reciting embodiments of the invention, as well as specific examples thereof, are intended to encompass both structural and functional equivalents thereof. Additionally, it is intended that such equivalents include both currently known equivalents as well as equivalents developed in the future (i.e., any elements developed that perform the same function, regardless of structure). Also, the terminology and phraseology used is for the purpose of describing exemplary embodiments and should not be considered limiting. Thus, the present invention is to be accorded the widest scope encompassing numerous alternatives, modifications, and equivalents consistent with the principles and features disclosed. For purpose of clarity, details relating to technical material that is known in the technical fields related to the invention have not been described in detail so as not to unnecessarily obscure the present invention.

Thus, for example, it will be appreciated by those of ordinary skill in the art that the diagrams, schematics, illustrations, and the like represent conceptual views or processes illustrating systems and methods embodying this invention. The functions of the various elements shown in the figures may be provided through the use of dedicated hardware as well as hardware capable of executing associated software. Similarly, any switches shown in the figures are conceptual only. Their function may be carried out through the operation of program logic, through dedicated logic, through the interaction of program control and dedicated logic, or even manually, the particular technique being selectable by the entity implementing this invention. Those of ordinary skill in the art further understand that the exemplary hardware, software, processes, methods, and/or operating systems described herein are for illustrative purposes and, thus, are not intended to be limited to any particular named element.

Embodiments of the present invention may be provided as a computer program product, which may include a machine-readable storage medium tangibly embodying thereon instructions, which may be used to program a computer (or other electronic devices) to perform a process. The term "machine-readable storage medium" or "computer-readable storage medium" includes, but is not limited to, fixed (hard) drives, magnetic tape, floppy diskettes, optical disks, compact disc read-only memories (CD-ROMs), and magneto-optical disks, semiconductor memories, such as ROMs, PROMs, random access memories (RAMs), programmable read-only memories (PROMs), erasable PROMs (EPROMs), electrically erasable PROMs (EEPROMs), flash memory, magnetic or optical cards, or other type of media/machine-readable medium suitable for storing electronic instructions (e.g., computer programming code, such as software or firmware). A machine-readable medium may include a non-transitory medium in which data may be stored and that does not include carrier waves and/or transitory electronic signals propagating wirelessly or over wired connections. Examples of a non-transitory medium may include, but are not limited to, a magnetic disk or tape, optical storage media such as compact disk (CD) or digital versatile disk (DVD), flash memory, memory, or memory devices. A computer-program product may include code and/or machine-executable instructions that may represent a procedure, a function, a subprogram, a program, a routine, a subroutine, a module, a software package, a class, or any combination of instructions, data structures, or program statements. A code segment may be coupled to another code segment or a hardware circuit by passing and/or receiving information, data, arguments, parameters, or memory contents. Information, arguments, parameters, data, etc. may be passed, forwarded, or transmitted via any suitable means including memory sharing, message passing, token passing, network transmission, etc.

Furthermore, embodiments may be implemented by hardware, software, firmware, middleware, microcode, hardware description languages, or any combination thereof. When implemented in software, firmware, middleware or microcode, the program code or code segments to perform the necessary tasks (e.g., a computer-program product) may be stored in a machine-readable medium. A processor(s) may perform the necessary tasks.

Systems depicted in some of the figures may be provided in various configurations. In some embodiments, the systems may be configured as a distributed system where one or more components of the system are distributed across one or more networks in a cloud computing system.

Each of the appended claims defines a separate invention, which for infringement purposes is recognized as including equivalents to the various elements or limitations specified in the claims. Depending on the context, all references below to the "invention" may in some cases refer to certain specific embodiments only. In other cases, it will be recognized that references to the "invention" will refer to subject matter recited in one or more, but not necessarily all, of the claims.

All methods described herein may be performed in any suitable order unless otherwise indicated herein or otherwise clearly contradicted by context. The use of any and all examples, or exemplary language (e.g., "such as") provided with respect to certain embodiments herein is intended merely to better illuminate the invention and does not pose a limitation on the scope of the invention otherwise claimed. No language in the specification should be construed as indicating any non-claimed element essential to the practice of the invention.

Various terms as used herein are shown below. To the extent a term used in a claim is not defined below, it should be given the broadest definition persons in the pertinent art have given that term as reflected in printed publications and issued patents at the time of filing.

The present disclosure generally relates to integrated circuits. More particularly, the present disclosure relates to a DFT architecture for testing integrated circuits using existing single I/O pins which eliminates the need for separate test pins. There is a general need in the current art for a design for testing (DFT) architecture that facilitates the testing of single input/output (I/O) pin integrated circuits (ICs), without any additional pin overhead that may specifically be required for testing. A key aspect of this architecture may include implementation of analog and digital test modes using a single I/O pin. This architecture could also include the reuse of the functional I/O pin as test pin.

An aspect of the present disclosure pertains to a system including design for testing (DFT) architecture for use in testing USBPD integrated circuits (ICs) using a single I/O pin. The system architecture includes an analog block including USBPD CC circuitry that detects the short circuit and over currents on CC pin, receives and transmits the data on CC pin for USBPD framework; and a digital block including a USBPD block handling USBPD communication packets and signaling data for USBPD framework, a controller configured to receive the CC pin, SC and OC detections, test related USBPD packet and signaling data from the USBPD block.

In an aspect, USBPD CC circuitry in analog block and USBPD block in digital block designed for USBPD framework are reused for test mode purposes in the proposed architecture.

In an aspect, the controller may be further configured to detect or activate a test mode based on the USB PD packet data and USB PD signaling data received on the CC pin.

In an aspect, the controller may be configured to control the test mode with respect to the DFT architecture.

In an aspect, the test modes includes an analog test mode comprising trims and observation modes, and a digital test mode comprising logic built-in self-test (LBIST) mode for covering and detecting the defects in the digital components associated with integrated circuits and an automatic test pattern generation (ATPG) mode operating at lower speeds which is directed to covering and further detecting the defects that are uncovered or undetected by the LBIST mode and digital observation mode for debug purposes. In an aspect, the analog and digital test modes are implemented with respect to the single I/O pin which is the CC pin with respect to USBPD integrated circuits.

In an aspect, the ATPG test mode operate based on a scan chain technique that includes a sequential shift-in phase and shift-out phase, with the CC pin corresponding to input and output respectively during shift-in and shift-out operation.

In an aspect, test parameters associated with the Analog and digital test modes are programmed through USBPD packet according to USB-C Power delivery protocol.

In an aspect, the scan shift-in and shift-out phases that occur simultaneously during the legacy ATPG scan shift phase are implemented sequentially.

In an aspect, the scan shift-in and the shift-out phases utilizes the single I/O pin for transmitting and receiving the scan data.

In an aspect, scan clock and data are encoded onto single I/O pin by reusing the USBPD BMC encoding framework with respect to testing of USBPD integrated circuit.

In an aspect, USBPD BMC framework related logic is tested as part of LBIST mode and excluded from scan in ATPG mode. In an aspect, scan shift-in, scan capture, scan shift-out and scan reset phases are automatically transitioned in the design without any external intervention based on the programmed chain length and pattern counts.

In an aspect, in one configuration, handshaking mechanism may be enabled between the IC and tester during ATPG mode, where in IC applies weak pull up on CC line at the end of each shift-out phase after completion of BMC encoded data transfer and tester sends the acknowledgment to IC by pulling the CC line low using a strong pulldown for CC pin direction change from TX to RX i.e. design transitions from shift-out phase to shift-in phase. Similarly, tester applies weak pullup on the CC line at the end of each shift-in phase after completion of the BMC encoded data transfer and IC sends acknowledgement to the tester by pulling the CC low using a strong pull down for CC pin direction change from RX to TX i.e. design transitions from shift-in phase to shift-out phase.

In an aspect, test mode reset, and test mode exit are automatically triggered in the design after the ATPG test completion without any external intervention based on the programmed pattern counts.

In an aspect, test mode reset, and test mode exit are automatically triggered in the design after the LBIST completion without any external intervention based on the BIST done indication from LBIST logic. Further, LBIST done and LBIST exit will be indicated to the tester on the CC pin.

In an aspect, LBIST logic block is tested as part of ATPG mode and excluded from scan in LBIST mode.

Another aspect of the present disclosure pertains to a method for testing an USBPD integrated circuit (IC). The method includes sending custom USBPD signaling and USBPD packets on the CC pin; configuring the test modes by means of custom USBPD packets on the CC pin; detecting the test mode entry based on the received custom USBPD signaling data and packets on CC pin; observing the test mode parameters on the CC pin; and causing an auto test mode exit or exiting by means of short circuit or over current on the CC pin.

In an aspect, during LBIST test mode, the method includes: configuring LBIST test mode parameters such as PRPG seed, pattern count, expected LBIST signature by means of a USB PD packet on the CC pin; triggering the LBIST test mode by means of USB PD packet on the CC pin; automatically resetting the digital logic and causing an LBIST test mode exit after the LBIST test mode completion without external intervention; and reading the LBIST test mode signature, status by means of a USB PD packet on the single CC pin.

In an aspect, during ATPG test mode, the method includes: configuring ATPG test mode parameters such as scan chain length, pattern count, LOC/LOES mode selects, scan clock frequency by means of a USB PD packet on the CC pin; triggering the ATPG test mode by means of USBPD packet on the CC pin; driving Scan data-in and scan clock on single CC pin by means of BMC encoding during scan shift-in phase of operation; driving scan data-out and scan clock on single CC pin by means of BMC encoding during scan shift-out phase of operation; automatically transitioning from scan shift-in to scan capture/reset, scan capture/reset to scan shift-out and scan shift-out to scan shift-in phases based on the programmed scan chain length without any external intervention; and automatically resetting the design and exiting the scan test mode based on the programmed pattern count without any external intervention.

In an aspect, during analog test mode the method includes: configuring the analog test mode parameters by means of USBPD packets on the CC pin; selecting the analog test modes by means of USBPD packets on the CC line; perform analog trimming by means of custom USBPD signaling; and observing the analog parameters on the CC line during test mode operation by means of custom USBPD signaling; and exiting the analog test modes by means of short circuiting CC line to GND or by driving over current onto CC line.

FIG. 1 illustrates an exemplary block diagram of the present embodiment of the invention. The exemplary embodiment of the invention is an integrated circuit (IC) or a chip which has a design for testing (DFT) architecture.

The exemplary embodiment primarily includes an analog block 120 and a digital block 130 for USBPD framework. The embodiment further includes a test controller 132 in the digital block 130 and a single input/output (I/O) pin. The single I/O pin is a typical feature of ICs and serves function of receiving, acting as a conduit or a communication path for various signals or instructions that may be received at the single I/O pin. This could also occur by means of another component in the IC, albeit in another embodiment. The single I/O pin for use as a test pin is typical of the exemplary embodiment. As is indicated in FIG. 1, the single I/O pin is used for all the test control and data purposes, i.e., to configure, activate, enable the testing, for observing the test results to conclude pass or fail, and for the test mode exit.

As shown in FIG. 1, the proposed DFT architecture 100 for USB PD systems can include a usage of a single pin i.e. a CC pin 110. In some embodiments, more than a single pin is also envisioned. The DFT architecture 100 includes an analog block 120 and a digital block 130. The analog block 120 further includes a CC TX/RX circuitry 122 for receiving and transmitting the data on the CC pin 110, a short circuit and an over current detection circuitry 124, which may be reused for test purposes. Similarly, for test purposes, a part of USB PD protocol logic, BMC encoder/decoder, PD signaling logic in the digital block 130 may be reused. For example, as shown in FIG. 1, with regards to test mode entry, test mode configuration parameters can be received on CC pin 110 by means of a custom USB PD signaling and USB PD packets. These can further be decoded by the USB PD protocol/signaling logic and informed to test mode controller 132.

Referring again to FIG. 1, in an embodiment, BMC encoder logic 136 is reused for encoding SDO (scan data out) and SCK (scan clock) on to single CC pin 110, eliminating a need for dedicated pins for SDO and SCK. BMC decoder logic decodes the SCK and SDI (scan data in) driven on CC pin 110, thus eliminating need for dedicated pins for SDI and SCK. Test mode controller 132 further configures and activates the test modes based on the signaling and packet information received from USB PD logic. In an aspect, test mode controller 132 can also handle automatic reset and exit from ATPG and LBIST test modes without any external intervention. In an aspect, test mode controller 132 can also handle auto sequencing from shift-in to capture/reset, capture/reset to shift-out and shift-out to shift-in phases without any external intervention based on the programmed chain length and pattern count in a first configuration or based on the acknowledgement mechanism and pattern count in a second configuration. LBIST logic 134 shown in FIG. 1 can be used for generating the LBIST patterns that will be applied to the scan chains in LBIST mode. LBIST logic 134 generates a unique signature based on the response from the scan chain with respect to the pattern applied. Further referring to FIG. 1, PIN MUX is used to mux the functional and test data on to the CC line 110 so that same functional CC may be reused for test purposes. Entire digital logic is tested in LBIST mode except test mode controller 132 and LBIST logic 134, as they are the primary blocks which enable testing in LBIST mode. Entire digital logic is tested in ATPG mode except test mode controller 132 and BMC encoder/decoder 136 as they are the primary blocks which enable the testing in ATPG mode. Hence, LBIST logic 134 is tested as part of ATPG mode and excluded from scan in LBIST mode. Similarly, BMC encoder/decoder 136 is tested as part of LBIST mode and excluded from scan in ATPG mode.

Test mode controller 132 typically controls the entry, exit and operation of all the analog and digital test modes supported by the proposed architecture 100. It can receive PD signaling, packet information from USBPD logic in digital block, SC/OC detection events from analog block 120 and generates, drives, receives the test controls and test data signals. As shown in FIG. 1, it can include the aspects of test mode entry 132-1, exit control 132-2, ATPG controller 132-3, LBIST control block(s) 132-4. Test mode entry 132-1 can activate or enable test modes based on PD signaling and PD data while test mode exit 132-2 can control test mode exit based on the auto exit or SC/OC detection events. LBIST control logic 132-3 is used to trigger LBIST operation and perform automatic reset, LBIST exit after the LBIST completion. Test mode controller 132 can also control the routing of appropriate test data on to CC pin during test mode operation based on the selected test mode of operation. Test mode controller 132 can control the CC Transmit (TX), Receive (RX) enables for transmitting or receiving the data on CC pin respectively based on the selected test mode of operation.

Referring again to FIG. 1, ATPG controller 132-3 can control the entire ATPG operation while other arrangements are also envisioned in other embodiments. ATPG controller 132-3 can route the SDI, SCK from BMC decoder logic (from 136) received on CC pin 110 to scan chains and routes SDO, SCK from scan chains to BMC encoder (from 136) for sending it on to CC pin 110. ATPG controller 132-3 can also control auto phase sequencing from shift-in to capture/reset, capture/reset to shift-out and shift-out to shift-in without any external intervention based on the scan cycle count and programmed scan chain length parameters. ATPG controller 132-3 can also perform automatic scan rest and exit after ATPG completion without any external intervention based on programmed pattern count parameter. The ATPG parameters comprising scan chain length, pattern counts, scan clock frequency, LOC/LOES mode selects can be programmed by means of USBPD packet before activating the ATPG test mode.

ATPG controller 132-3 as described previously, can control the ATPG scan mode operation. Here, the ATPG operation is primarily based on receiving the SDI/SCK on single CC pin 110 and sending SDO/SCK on single CC pin 110 using BMC decoder/encoder 136, respectively.

Those of ordinary skill in the art further understand that the exemplary that size of the blocks in diagram doesn't represent actual blocks gate count or size.

Figure 2:
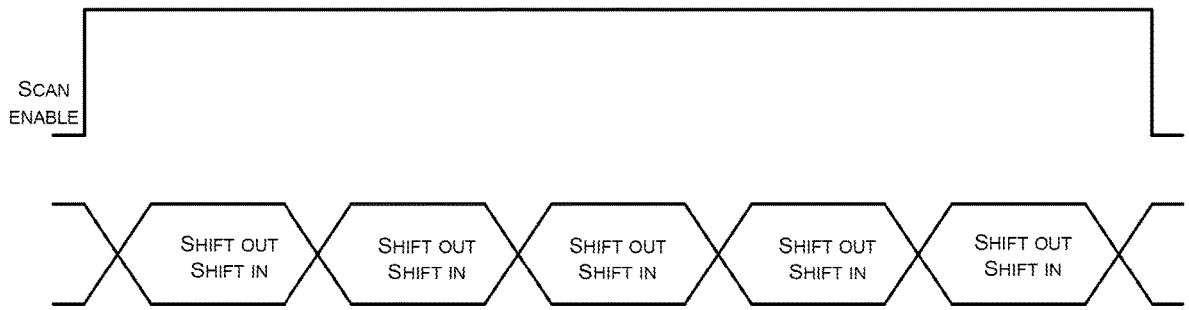
FIG. 2 illustrates an exemplary representative diagram showing difference between legacy chain test against the proposed sequential chain test phases, in accordance with an embodiment of the present disclosure.
Figure 2:
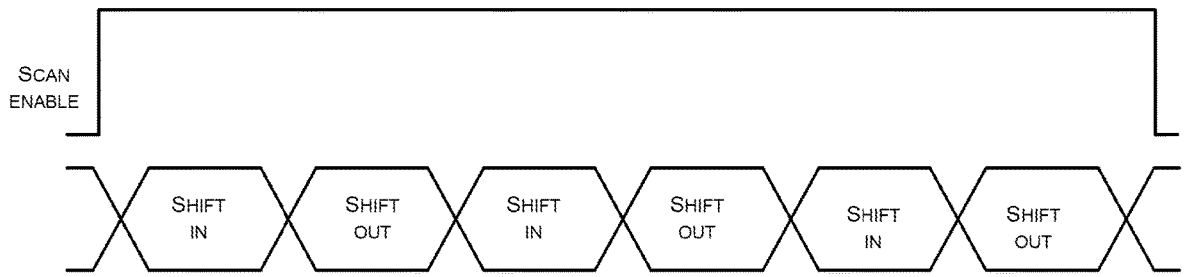
Figure 3:
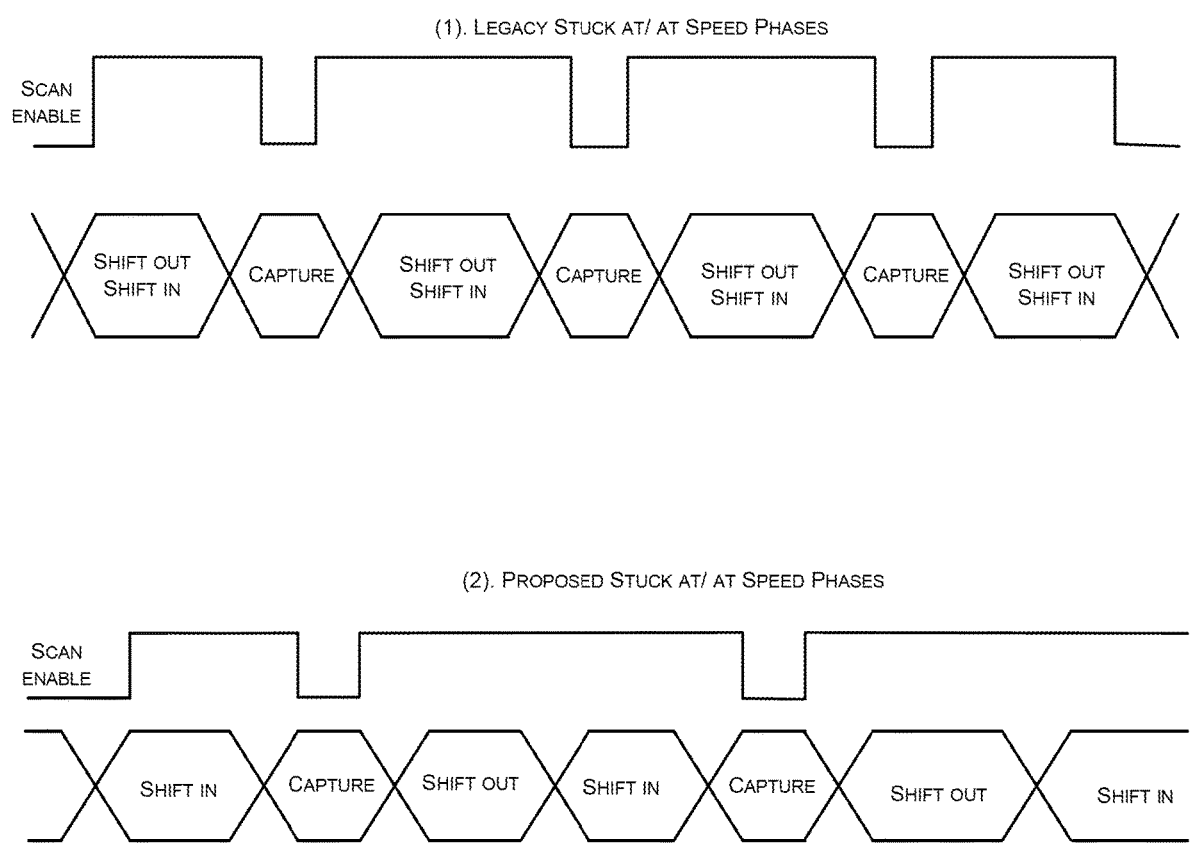
FIG. 3 illustrates an exemplary representative diagram showing difference between legacy stuck-at/at speed test against the proposed sequential stuck-at/at speed test phases, in accordance with an embodiment of the present disclosure.

FIGS. 2 and 3 illustrate representations of differences in sequential scan shift-in and scan shift-out operations against legacy non-sequential shift-in and shift-out operations. Sequential scan shift-in and shift-out operation may be implemented in the proposed DFT architecture such that the same CC pin can be used for SDI and SDO, where SDI/SCK are driven by the tester on CC pin during shift-in phase and SDO/SCK are driven by the IC on CC pin during shift-out phase. Whereas, in legacy in scan chain-based techniques dedicated pin are used for SDI, SDO and SCK. The shift-in and shift-out can happen simultaneously in the legacy scan based approach requiring two dedicated pins for SDI and SDO. As shown in FIG. 3, shift-in and shift-out phases occur sequentially in the proposed architecture and hence same CC pin can be used for SDI during shift-in phase and SDO during shift-out phase. ATPG controller 132-2 is based on auto phase sequencing, reset and test mode exit. ATPG controller block shown in FIG. 1 primarily receives CC pin 110 BMC decoded scan data/clk and routes it to scan chain. Similarly, it also routes scan chain output data and clock to BMC encoder for sending out to CC pin 110. Referring again to FIG. 1, auto-phase sequencing is performed based on the scan clock cycle count, programmed chain length, pattern type. Scan clock cycles are counted during each phase of operation using up counter and shift-in phase to capture/reset/shift-out phase toggle/change happens when scan cycle count reaches the chain length. Similarly shift-out to shift-in happens when scan cycle count reaches chain length. Capture phase to shift-out toggle happens when scan cycle count value reaches 1 for stuck-at pattern or 2 for at speed pattern. In another configuration, transition from one phase to other can happen based on acknowledgement mechanism between tester and the IC. The IC may apply weak pull up on the CC line at the end of each shift-out phase after completion of BMC encoded data transfer and tester may send the acknowledgment to the IC by pulling the CC line low using a strong pulldown for direction change of the CC pin from TX to RX i.e. from shift-out to shift-in. The tester may apply weak pullup on the CC line at the end of each shift-in phase after completion of the BMC encoded data transfer and IC can send acknowledgement to the tester by pulling the CC low using a strong pull down for direction change of CC pin from RX to TX i.e. from shift-in/capture phase to capture/shift-out phase depending on pattern type. Automatically chain, reset, stuck-at and at-speed are executed one after the other based on the programmed pattern counts. Automatic transition from one pattern type to other pattern type can thus occur based on the pattern counter values and configured pattern counts. Automatic reset and exit from ATPG mode may happen after the entire patterns get completed and pattern count reaches maximum.

Figure 4A:
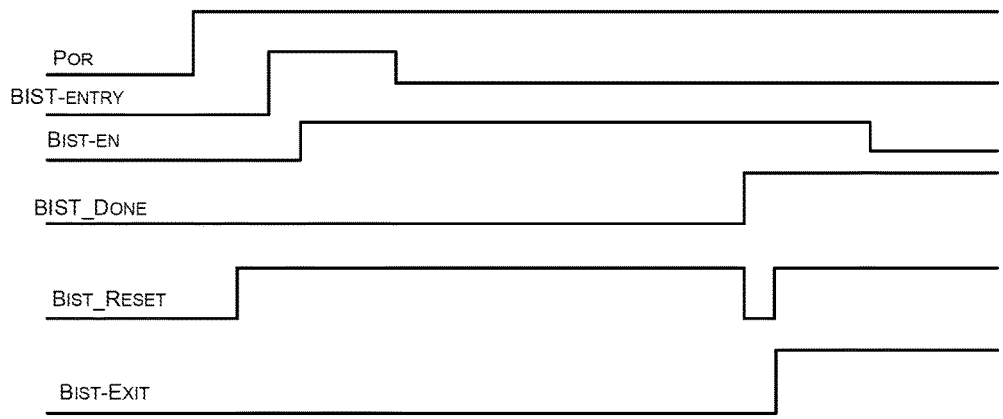
FIGS. 4A and 4B illustrate exemplary LBIST test mode timing diagrams, in accordance with an embodiment of the present disclosure.
Figure 4B:
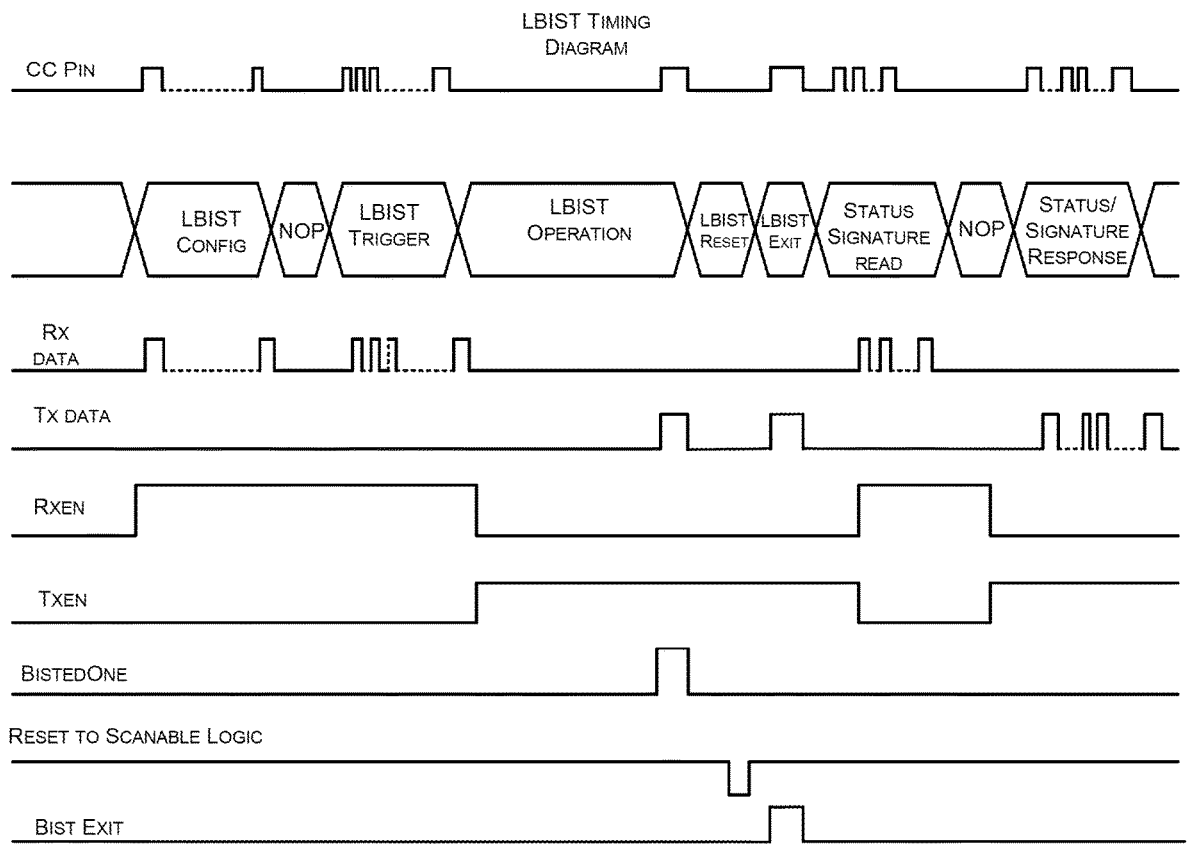

FIGS. 4A and 4B illustrate exemplary LBIST test mode timing diagrams, in accordance with an embodiment of the present disclosure.

FIG. 4A shows timing diagram of the LBIST control signals related to entry, reset and exit. BIST_ENTRY may be generated based on the USBPD packet received on the CC pin which may be further used by the LBIST CONTROL block 132-4 in the TEST MODE CONTROLLER 132 to generate BIST_EN to the LBIST CONTROLLER 134 which may trigger the LBIST operation. LBIST CONTROLLER 134 may send BIST_DONE indication to TEST MODE CONTROLLER 132 on LBIST completion. LBIST CONTROL block 132-4 in TEST MODE CONTROLLER 132 further automatically can generate test mode reset followed test mode exit as indicated by BIST_RESET and BIST_EXIT signals in FIG. 4A.

FIG. 4B shows timing diagram of complete LBIST flow of the ICs having proposed architecture. By default, CC line is in RX mode for receiving data from the external devices. LBIST phases as shown in FIG. 4B may starts with LBIST CONFIG during which external devices like tester may configure the LBIST parameters inside the design by sending USBPD packets on CC pin. This may be followed by LBIST TRIGGER phase during which tester may send USBPD packet to trigger LBIST operation. Design on decoding the LBIST trigger information from the USBPD packet transition to LBIST OPERATION phase during which the entire LBIST operation can happen in the design whose completion may be indicated by the BIST_DONE signal generated by the LBIST controller which may be indicated to tester on CC pin. Design then automatically may transition to LBIST RESET phase followed by LBIST exit phase and may indicate the same on CC pin to the external tester device. Tester then may send the USBPD packet on CC pin for status and signature read which may be responded by the design with USBPD packet containing status and signature. Same CC line may be used by the tester in RX mode to configure the LBIST, trigger the LBIST, read LBIST signature and status. Same CC line may be used by the design in TX mode to indicate BIST done, exit and to send out signature and status to the tester. CC line direction/mode during LBIST operation can be indicated by RX_EN and TX_EN as shown in FIG. 4B.

Figure 5:
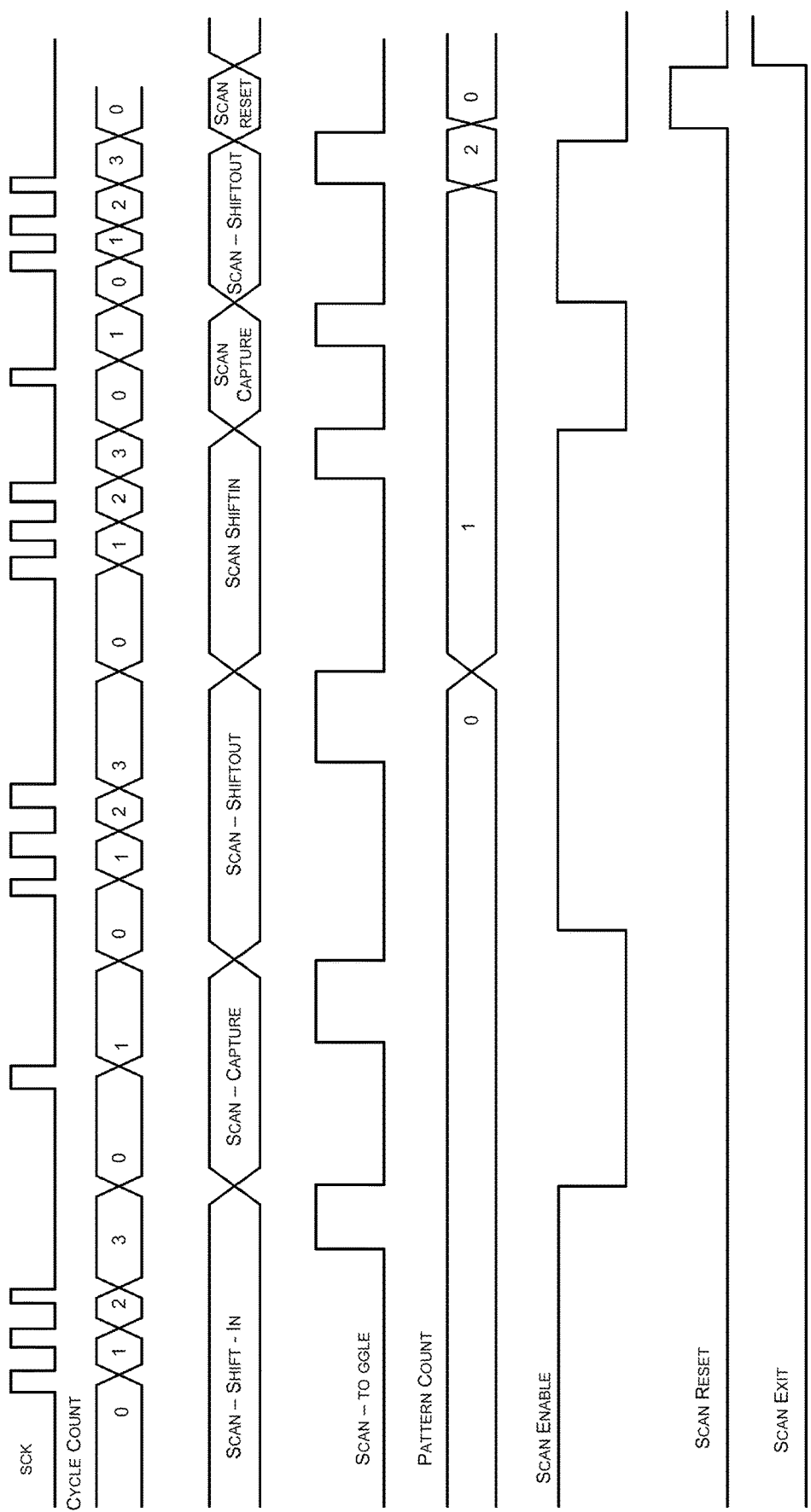
FIG. 5 illustrates an exemplary timing diagram of an ATPG auto phase/reset and exit, in accordance with an embodiment of the present disclosure.

FIG. 5 illustrates an exemplary timing diagram of an ATPG auto phase/reset and exit, in accordance with an embodiment of the present disclosure. It represents complete ATPG flow for an example case whose chain length is 3, chain pattern count is 0, reset pattern count is 0, at speed pattern count is 0 and stuck at pattern count is 2. ATPG scan operation in the proposed architecture comprises of sequential shift-in, capture and shift-out phases as indicated in FIG. 3 and FIG. 4. Each pattern can start with scan shift-in phase during which tester can send scan data in (SDI) and Scan clock (SCK) on CC line in BMC format which may be decoded by the design and routed to scan chains. Since scan chain length may be at least 3 in a way of this example, but not by way of limitation, design on counting at least 3 Scan clock pulses automatically may transition to Scan capture phase as pattern type may be stuck-at (other pattern counts are 0 in this example, so only stuck-at pattern is executed). Design automatically may generate one scan clock cycle during capture phase since pattern type is stuck-at and then transitions to scan shift-out phase. During the scan shift-out phase, design may send BMC encoded Scan data out (SDO) and SCK on CC pin for 3 clock cycles since the scan chain length is 3. Design then automatically may increment pattern count by 1 and then may transition to scan shift-in phase of next pattern and entire sequence may be repeated followed by pattern count increment to at least 2 but not limited to it. Since total patterns in the way of example but not as a limitation, are at least 2, design automatically may transition to scan reset and scan exit phases as shown in FIG. 4B. Design internally may generate scan enable signal in accordance with the scan shift-in, capture and shift-out phases which is represented in FIG. 4B.

Figure 6:
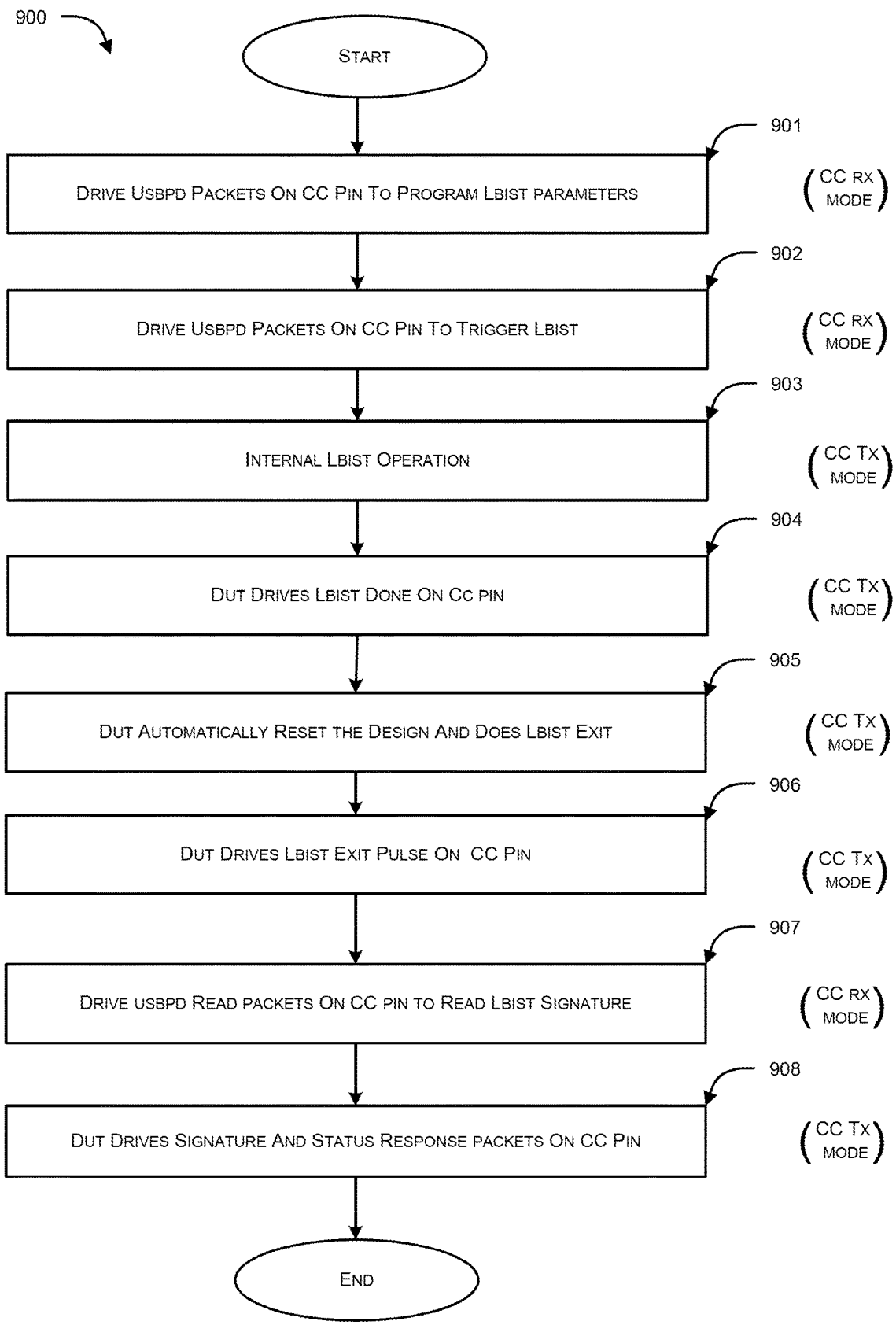
FIG. 6 illustrates an exemplary flow diagram for LBIST implementation, in accordance with an embodiment of the present disclosure.

FIG. 6 illustrates an exemplary flow diagram 900 for LBIST implementation, in accordance with an embodiment of the present disclosure. Below are the LBIST flow steps. At 901, LBIST parameters like such as PRPG seed, pattern counts and expected signature are programmed by means of PD packets on CC pin 110. At 902, LBIST is triggered using PD packets on the CC pin 110. Here, LBIST logic 134 inside DUT can perform the LBIST testing. Test mode control logic 132 inside DUT takes care of multiplexing the LBIST_DONE on to CC pin 110. Thereafter, DUT automatically resets the logic and automatically exits the test mode and test mode control logic 132 inside DUT takes care of multiplexing LBIST_EXIT pulse on to CC pin 110 to indicate test mode exit to the tester. LBIST status and signature are stored in the registers inside DUT. At 907 LBIST status and signature can be read from the DUT registers using USB PD packets on CC pin 110. Here, DUT responds with lbist status and signature using USBPD packets on CC pin 110. Referring to 904-908, the operation terminates with the DUT driving signature and status response packets on CC pin 110.

Figure 7:
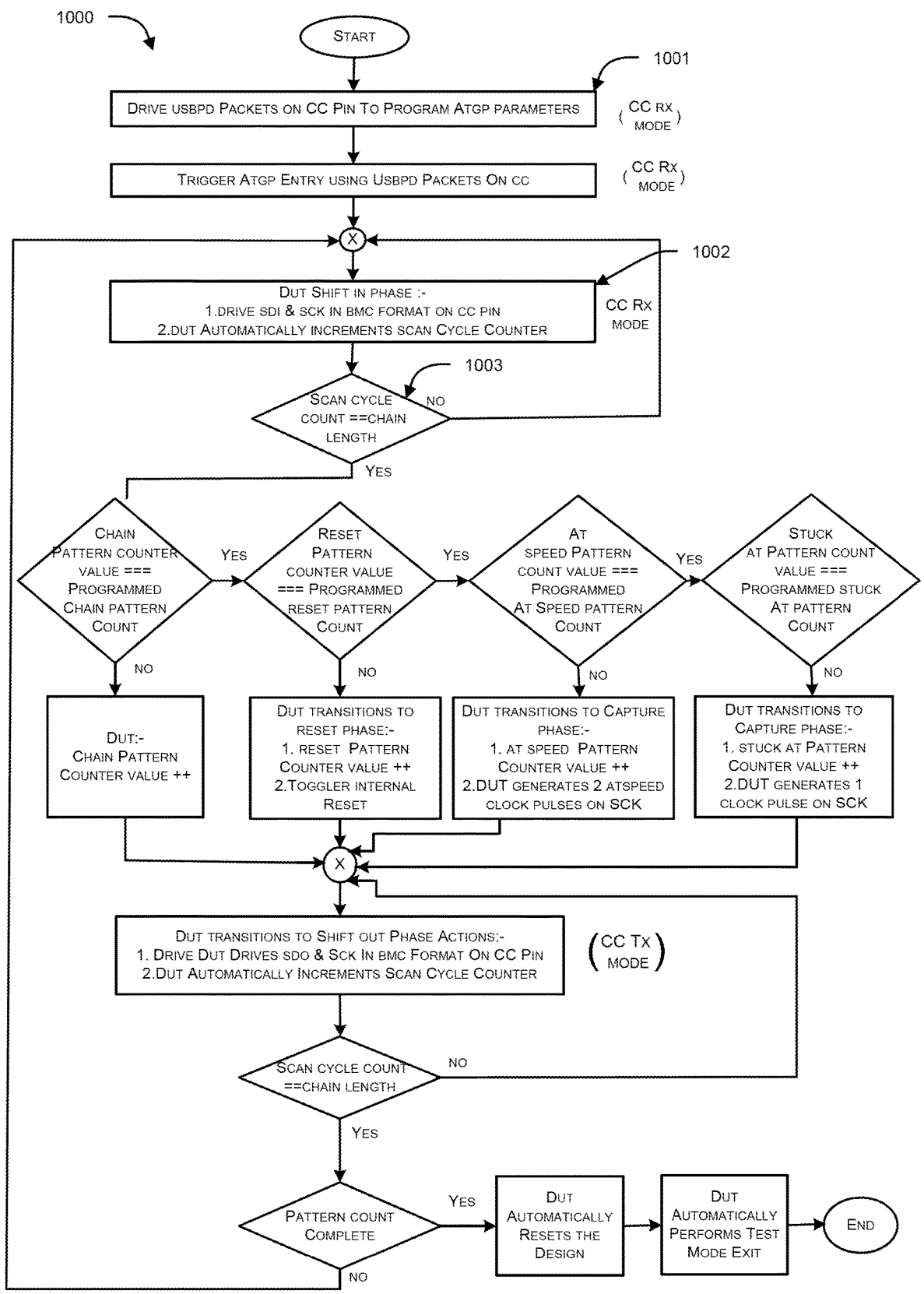
FIG. 7 illustrates an exemplary flow diagram for ATPG implementation, in accordance with an embodiment of the present disclosure.

FIG. 7 illustrates an exemplary flow diagram 1000 for ATPG implementation, in accordance with an embodiment of the present disclosure. Below are the ATPG test flow directions. At 1001, ATPG parameters like chain length, pattern counts, scan clock frequencies, LOC/LOES mode selects are programmed by means of PD packets on CC pin 110 with the ATPG being triggered using USBPD packets on CC pin 110. Proposed architecture 300 primarily uses below features to do ATPG testing using single CC pin 110: (i) executing ATPG at lower speeds as it is targeted only for covering the faults undetected by LBIST and using the USB PD BMC encoding/decoding framework so that Scan data and scan clock can be encoded onto single CC pin 110; (ii) executing ATPG shift-in and shift-out phases sequentially instead of executing them simultaneously so that single CC pin 110 can be used for shift-in and shift-out purposes; (iii) DUT automatically transitioning from one scan phase to other depending on the chain length, pattern count and type of pattern being executed without any external intervention.

Referring again to FIG. 7, at 1002, DUT enters scan shift-in mode by default and CC will be enabled in RX mode as shown. Here, at shift-in the scan data input and scan clock on the single CC pin is by means of BMC encoding. DUT automatically transitions to scan capture or scan reset or scan shift-out phase when scan cycle count in shift-in phase reaches chain length at 1003. Next, DUT generates scan clock during capture phase based on the type of pattern being executed. DUT automatically transitions from scan-reset, scan-capture phases to shift-out phase following which DUT starts shifting out scan data out and scan clock on CC pin 110 using BMC encoding. Shifted out BMC data should be decoded to scan data out and scan clock and can be compared with the expected pattern. The above-mentioned are repeated until the total patterns are executed. Finally, DUT automatically performs the scan reset to reset the logic followed by scan mode exit after the pattern completion.

Figure 8:
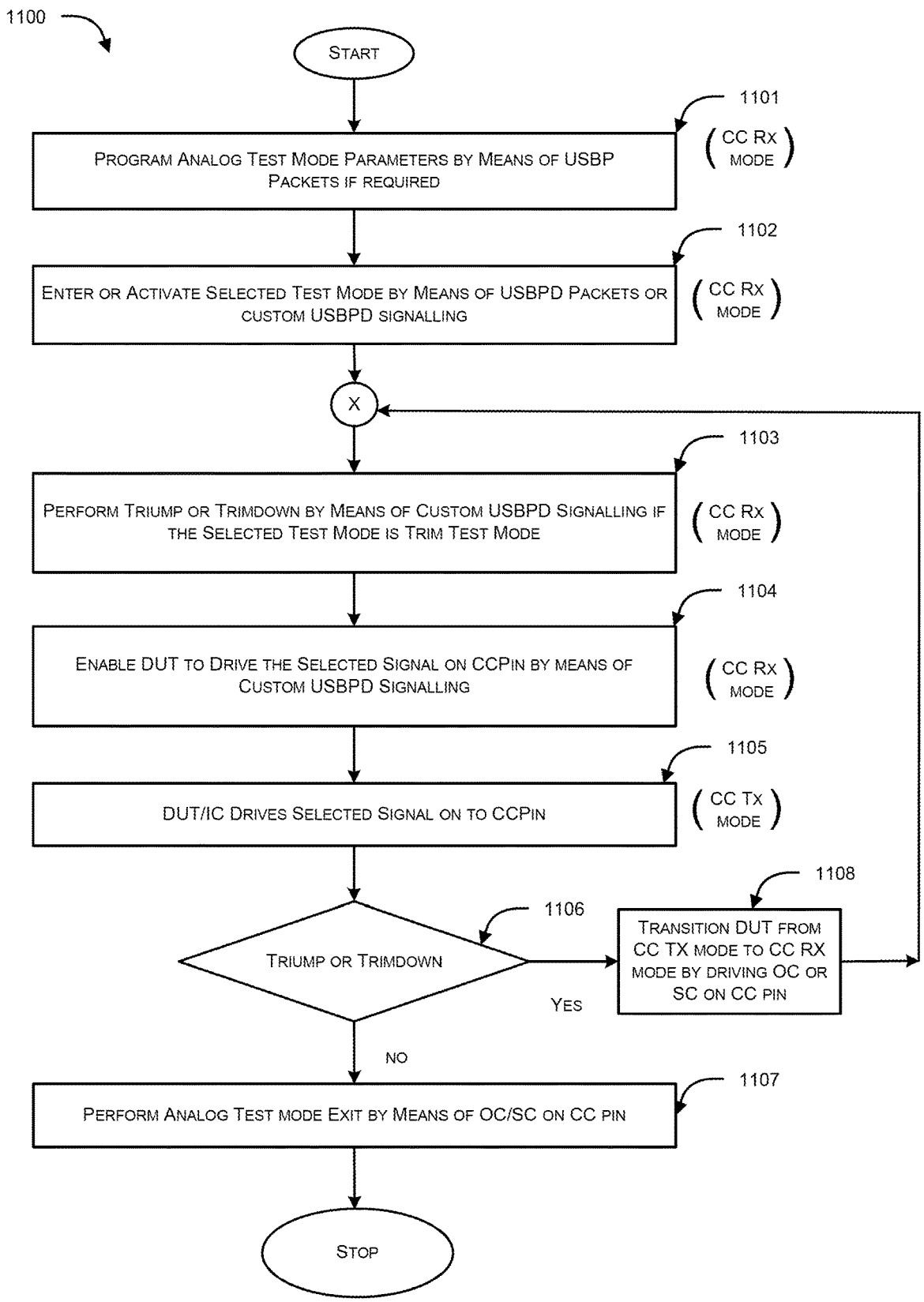
FIG. 8 illustrates an exemplary flow diagram for analog block implementation, in accordance with an embodiment of the present disclosure.

FIG. 8 illustrates an exemplary flow diagram 1100 for analog test modes, in accordance with an embodiment of the present disclosure. Below are the analog test flow steps. At 1101, Analog test mode parameters are programmed by means of USBPD communication packet on CC pin 110 if required. At 1102, selected analog test mode is enabled or activated by means of USBPD communication packet or custom USBPD signaling on CC pin 110. At 1103, Analog trim up or trim down is performed by means of custom USB-PD signaling on CC pin 110 if selected test mode is trim test mode. At 1104, USBPD signaling is used to enable the DUT to drive the selected signal on to the CC pin 110. At 1105, DUT drives the selected analog signals on CC pin 110 while at 1106, if it is decided to perform trim up or trim down by the tester, then at 1108, transition DUT from CC TX mode to CC RX mode by driving OC or SC on CC pin after which a repetition of 1103-1106 occurs else test mode exit is performed by means of short circuit or over current on the CC line at 1107.

Figure 9:
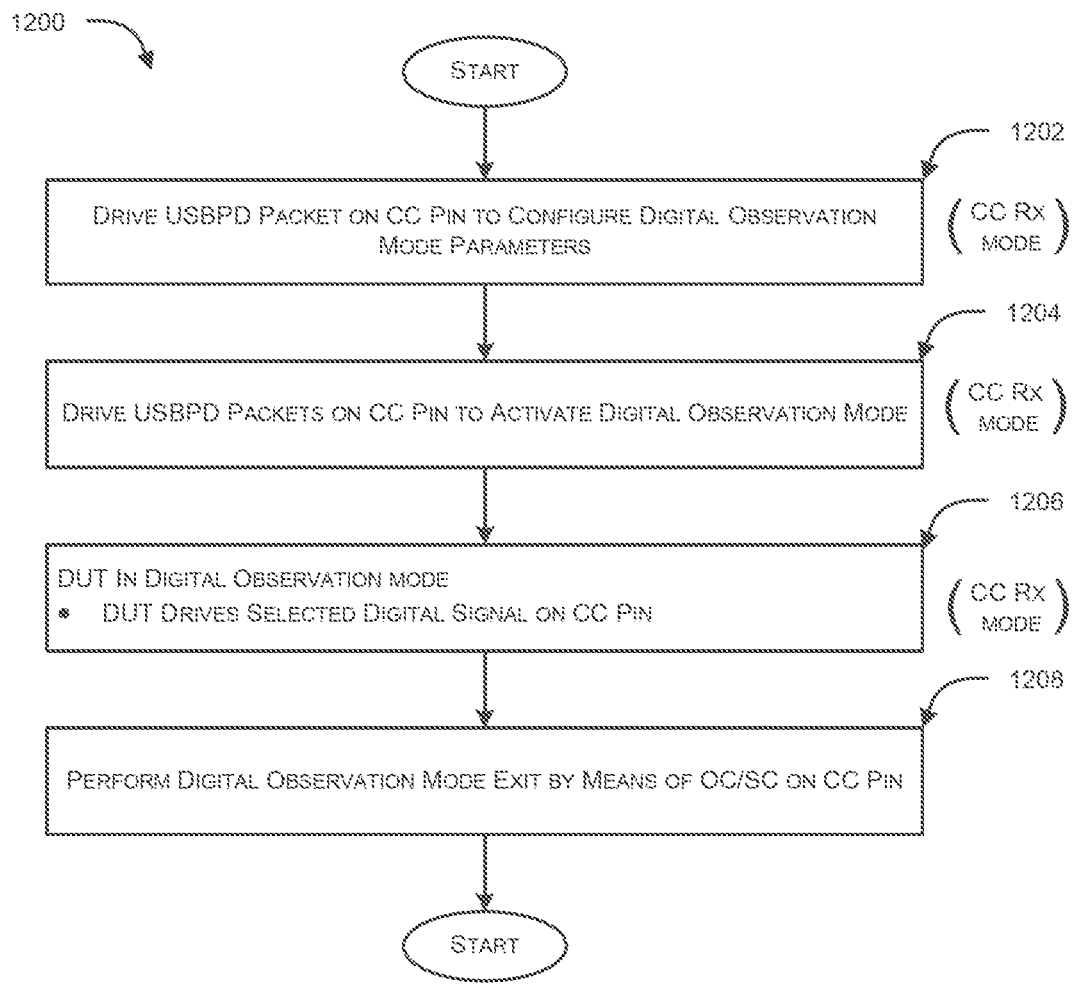
FIG. 9 illustrates an exemplary flow diagram for a digital observation mode, in accordance with an embodiment of present disclosure

FIG. 9 illustrates an exemplary flow diagram 1200 for a Digital observation mode, in accordance with an embodiment of present disclosure. At 1202, digital observation mode parameters are configured by means of USBPD packet on CC pin 110. At 1204, digital observation mode is enabled by means of USBPD packets on CC pin 110. At 1206, DUT drives the selected internal signals on to CC pin. This is followed by test mode exit by means of Short circuit or open circuit on CC pin at 1208.

Various components/units of the proposed system can be implemented as a combination of hardware and programming (for example, programmable instructions) to implement their one or more functionalities as elaborated further themselves or using processors. In examples described herein, such combinations of hardware and programming can be implemented in several different ways. For example, the programming for the units can be processor executable instructions stored on a non-transitory machine-readable storage medium and the hardware for units can include a processing resource (for example, one or more processors), to execute such instructions. In the present examples, the machine-readable storage medium can store instructions that, when executed by the processing resource, implements the various units. In such examples, the system can include the machine-readable storage medium storing the instructions and the processing resource to execute the instructions, or the machine-readable storage medium can be separate but accessible to the system and the processing resource. In other examples, the units can be implemented by electronic circuitry. A database can include data that is either stored or generated as a result of functionalities implemented by any of the other components/units of the proposed system.

While this disclosure pertains to an IC having a DFT architecture with the aforementioned features and aspects, other variations are possible as can be appreciated by those skilled in the art.

It would be appreciated that although the proposed system has been elaborated as above to include all the main units, it is conceivable that actual implementations are well within the scope of the present disclosure, which can include without any limitation, only a part of the proposed units or a combination of those or a division of those into sub-units in various combinations across multiple devices that can be operatively coupled with each other, including in the cloud. Further, the units can be configured in any sequence to achieve objectives elaborated. Also, it can be appreciated that proposed system can be configured in a computing device or across a plurality of computing devices operatively connected with each other, wherein the computing devices can be any of a computer, a laptop, a smart phone, an Internet enabled mobile device and the like. Therefore, all possible modifications, implementations, and embodiments of where and how the proposed system 100 is configured are well within the scope of the present invention.

Thus, it will be appreciated by those of ordinary skill in the art that the diagrams, schematics, illustrations, and the like represent conceptual views or processes illustrating systems and methods embodying this invention. The functions of the various elements shown in the figures can be provided through the use of dedicated hardware as well as hardware capable of executing associated software. Similarly, any switches shown in the figures are conceptual only. Their function can be carried out through the operation of program logic, through dedicated logic, through the interaction of program control and dedicated logic, or even manually, the particular technique being selectable by the entity implementing this invention. Those of ordinary skill in the art further understand that the exemplary hardware, software, processes, methods, and/or operating systems described herein are for illustrative purposes and, thus, are not intended to be limited to any particular named.

While embodiments of the present invention have been illustrated and described, it will be clear that the invention is not limited to these embodiments only. Numerous modifications, changes, variations, substitutions, and equivalents will be apparent to those skilled in the art, without departing from the spirit and scope of the invention, as described in the claim.

In the foregoing description, numerous details are set forth. It will be apparent, however, to one of ordinary skill in the art having the benefit of this disclosure, that the present invention can be practiced without these specific details. In some instances, well-known structures and devices are shown in block diagram form, rather than in detail, to avoid obscuring the present invention.

As used herein, and unless the context dictates otherwise, the term "coupled to" is intended to include both direct coupling (in which two elements that are coupled to each other contact each other) and indirect coupling (in which at least one additional element is located between the two elements). Therefore, the terms "coupled to" and "coupled with" are used synonymously. Within the context of this document terms "coupled to" and "coupled with" are also used euphemistically to mean "communicatively coupled with" over a network, where two or more devices are able to exchange data with each other over the network, possibly via one or more intermediary device.

It should be apparent to those skilled in the art that many more modifications besides those already described are possible without departing from the inventive concepts herein. The inventive subject matter, therefore, is not to be restricted except in the spirit of the appended claims. Moreover, in interpreting both the specification and the claims, all terms should be interpreted in the broadest possible manner consistent with the context. In particular, the terms "comprises" and "comprising" should be interpreted as referring to elements, components, or steps in a non-exclusive manner, indicating that the referenced elements, components, or steps can be present, or utilized, or combined with other elements, components, or steps that are not expressly referenced. Where the specification claims refers to at least one of something selected from the group consisting of A, B, C . . . and N, the text should be interpreted as requiring only one element from the group, not A plus N, or B plus N, etc.

While the foregoing describes various embodiments of the invention, other and further embodiments of the invention can be devised without departing from the basic scope thereof. The scope of the invention is determined by the claims that follow. The invention is not limited to the described embodiments, versions, or examples, which are included to enable a person having ordinary skill in the art to make and use the invention when combined with information and knowledge available to the person having ordinary skill in the art.

The present disclosure provides a DFT architecture for testing integrated circuits using existing single I/O pins.

The present disclosure provides a simple and cost effective DFT architecture for testing integrated circuits using existing single I/O pins.

The present disclosure provides a reliable and efficient DFT architecture for testing integrated circuits using existing single I/O pins.

The present disclosure provides a robust DFT architecture for testing integrated circuits using existing single I/O pins.

The present disclosure provides a DFT architecture for testing integrated circuits by analog and digital testing by using existing single I/O pins that eliminates the need for separate test pins.

The present disclosure provides a DFT architecture for a USBPD framework for testing.

We claim:

1. A system for facilitating design for testing (DFT) architecture for use in testing an integrated circuits (IC) associated with universal serial bus power delivery (USBPD) using a single input-output (I/O) pin, the system comprising:
    an analog block comprising a USBPD configuration channel (CC) circuitry that detects short circuit (SC) and over currents (OC) on a CC pin, receives and transmits data on the CC pin for a USBPD framework;
    a digital block comprising a USBPD block handling USBPD communication packets and signalling; and
    a test mode controller configured to receive CC pin input/output (I/O) data, SC detection, and OC detection, as well as test related USBPD packet and signalling data from the USBPD block,
    wherein the test mode controller is configured to detect or activate a test mode based on a USB PD packet data and USB PD signalling data received on the CC pin, wherein the test mode controller is configured to control the test mode with respect to the DFT architecture,
    wherein the test modes includes an analog test mode comprising trims and observation modes, and a digital test mode comprising logic built-in self-test (LBIST) mode for covering and detecting defects in digital components associated with integrated circuits, an automatic test pattern generation (ATPG) mode operating at lower speeds which is directed to covering and further detecting the defects that are uncovered or undetected by the LBIST mode and digital observation modes for debug purposes,
    wherein the analog and digital test modes are implemented with respect to the single I/O pin which is the CC pin with respect to USBPD integrated circuits, and
    wherein the ATPG test mode operates based on a scan chain technique that includes a sequential shift-in phase and shift-out phase, with the CC pin corresponding to input and output respectively during shift-in and shift-out operation.

2. The system as claimed in claim 1, wherein test parameters associated with the analog and digital test modes are programmed through USBPD packet according to USB-C Power delivery protocol.

3. The system as claimed in claim 1, wherein the scan shift-in and shift-out phases that occur simultaneously during a legacy ATPG scan shift phase are implemented sequentially.

4. The system as claimed into claim 3, wherein the scan shift-in and the shift-out phases utilizes the single I/O pin for transmitting and receiving the scan data.

5. The system as claimed in claim 4, wherein scan clock and data are encoded onto single I/O pin by reusing a USBPD Biphase Mark Coding (BMC) encoding-decoding framework with respect to testing of USBPD integrated circuit, wherein the USBPD BMC encoding framework is tested as part of LBIST mode and excluded from scan in the ATPG mode.

6. The system as claimed in claim 3, wherein scan shift-in, scan capture, scan shift-out and scan reset phases are automatically transitioned in the design without any external intervention based on programmed chain length and pattern counts.

7. The system as claimed in claim 6, comprising a configuration, wherein a handshaking mechanism is enabled between the IC and a tester during the ATPG mode, wherein the IC applies a weak pull up on a CC line at the end of each shift-out phase after completion of Biphase Mark Coding (BMC) encoded data transfer and tester sends an acknowledgment to the IC by pulling the CC line low using a strong pulldown for transitioning scan phase from shift-out to shift-in and direction change of the CC pin from TX to RX, wherein the tester applies weak pullup on the CC line at the end of each shift-in phase and each capture phase after completion of the BMC encoded data transfer and IC sends acknowledgement to the tester by pulling the CC low using a strong pull down for transitioning scan phase from shift-in to capture or shift-out as well as from capture to shiftout and direction change of CC pin from receiver (RX) to transmitter (TX) while transitioning to shift-out phase.

8. The system as claimed in claim 3, where in test mode reset and test mode exit are automatically triggered in the design after an ATPG test completion without any external intervention based on a programmed pattern counts.

9. The system as claimed in claim 1, wherein test mode reset and test mode exit are automatically triggered in the design after LBIST completion without any external intervention based on a BIST done indication from LBIST logic, wherein BIST done, and exit are indicated on the CC pin to a tester.

10. A method for testing a universal serial bus power delivery (USBPD) integrated circuit (IC), the method comprising:
sending custom USBPD signaling and USBPD packets on a configuration channel (CC) pin;
configuring test modes by custom USBPD packets on the CC pin;
detecting a test mode entry based on received custom USBPD signaling data and packets on CC pin;
observing a test mode parameters on the CC pin;
causing an auto test mode exit or exiting with a short circuit or over current on the CC pin; and
applying design for testing (DFT) architecture in the testing of the USBPD integrated circuit for the DFT test mode entry detection through the custom USBPD signaling data and packets which are decoded,
wherein, during a logic built-in self-test (LBIST) test mode, the method further comprises:
configuring LBIST test mode parameters, the LBIST test mode parameters comprising one or more of PRPG seed, pattern count, and expected LBIST signature, by a USBPD packet on the CC pin;
triggering the LBIST test mode with the USBPD packet on the CC pin;
automatically resetting a digital logic and causing an LBIST test mode exit after completion of the LBIST test mode without external intervention; and
reading a status of the LBIST test mode signature from the USBPD packet on a single CC in.

11. A method for testing a universal serial bus power delivery (USBPD) integrated circuit (IC), the method comprising:
sending custom USBPD signaling and USBPD packets on a configuration channel (CC) pin; configuring test modes by custom USBPD packets on the CC pin;
detecting a test mode entry based on received custom USBPD signaling data and packets on CC pin;
observing a test mode parameters on the CC pin;
causing an auto test mode exit or exiting with a short circuit or over current on the CC pin; and
applying design for testing (DFT) architecture in the testing of the USBPD integrated circuit for the DFT test mode entry detection through the custom USBPD signaling data and packets which are decoded,
wherein, during automatic test pattern generation (ATPG) test mode, the method further comprises:
configuring ATPG test mode parameters, the ATPG parameters comprising one or more of scan chain length, pattern count, launch on capture (LOC) or Launch-On Extra-Shift (LOES) mode select, and scan clock frequency with a USB PD packet on the CC pin;
triggering the ATPG test mode with the USBPD packet on the CC pin;
driving scan data-in and scan clock on single CC pin with Bi phase Mark Coding (BMC) encoding during scan shift-in phase of operation;
driving scan data-out and scan clock on single CC pin with BMC encoding during scan shift-out phase of operation;
automatically transitioning from scan shift-in to scan capture/reset, scan capture/reset to scan shift-out and scan shift-out to scan shift-in phases based on a programmed scan chain length and based on one or more of a pattern count without any external intervention in a first configuration and acknowledgement mechanism and the pattern count in a second configuration; and automatically resetting the design and exiting the scan test mode based on a programmed pattern count without any external intervention.

12. The method according to claim 11, wherein, during a digital observation mode, the method further comprises:
configuring test mode parameters, the test mode parameters comprising digital observation multiplexer selects, with USBPD packets on the CC pin:
selecting the digital observation mode with custom USBPD packets on the CC pin; observing internal digital signals on the CC pin during test mode operation; and
exiting the digital observation test mode with a short circuit or over current on the CC pin.

13. The method as claimed in claim 12, wherein, during an analog test mode, the method further comprises:
configuring analog test mode parameters with USBPD packets on the CC pin;
selecting analog test modes through one or more of USBPD packets and custom USBPD signaling on the CC pin, performing analog trimming with the custom USBPD signaling on the CC Pin;
observing the analog parameters on a CC line during test mode operation through custom USBPD signaling; and
exiting the analog test modes by short circuiting the CC line to ground (GND) or by driving over current onto the CC line.

* * * * *